(12) United States Patent
Drewery

(10) Patent No.: US 6,743,661 B1
(45) Date of Patent: Jun. 1, 2004

(54) METHOD OF FABRICATING AN INTEGRATED CIRCUIT PACKAGE UTILIZING AN INTERPOSER SURROUNDED BY A FLEXIBLE DIELECTRIC MATERIAL WITH CONDUCTIVE POSTS

(75) Inventor: John Stephen Drewery, Alameda, CA (US)

(73) Assignee: Novellus Systems, Inc., San Jose, CA (US)

(*) Notice: Subject to any disclaimer, the term of this patent is extended or adjusted under 35 U.S.C. 154(b) by 0 days.

(21) Appl. No.: 10/246,133

(22) Filed: Sep. 17, 2002

Related U.S. Application Data

(62) Division of application No. 09/895,523, filed on Jun. 29, 2001, now Pat. No. 6,525,407.

(51) Int. Cl.[7] .................. H01L 21/48; H05K 3/30
(52) U.S. Cl. .................. 438/110; 438/113; 438/458; 438/460; 438/622; 29/841; 29/855
(58) Field of Search .................. 438/22, 26, 48, 438/106, 107, 109, 110, 33, 113, 455, 458, 459, 460, 597, 618, 622, 623; 29/592, 592.1, 825, 829, 832, 841, 854, 855; 257/678, 685, 686, 698, 701–703, 723, 724, 734, 758, 759, 773, 774

(56) References Cited

U.S. PATENT DOCUMENTS

| | | | | |
|---|---|---|---|---|
| 4,803,595 A | * | 2/1989 | Kraus et al. | 361/784 |
| 5,177,594 A | * | 1/1993 | Chance et al. | 257/678 |
| 6,525,407 B1 | * | 2/2003 | Drewery | 257/666 |
| 6,614,106 B2 | * | 9/2003 | Matsuo et al. | 257/698 |
| 2002/0039807 A1 | * | 4/2002 | Koyama | 438/106 |
| 2002/0094601 A1 | * | 7/2002 | Su et al. | 438/106 |

FOREIGN PATENT DOCUMENTS

| | | | | |
|---|---|---|---|---|
| EP | 520841 A1 | * | 12/1992 | H01L/21/60 |

* cited by examiner

*Primary Examiner*—Alonzo Chambliss
(74) *Attorney, Agent, or Firm*—Martine & Penilla, LLP

(57) ABSTRACT

An apparatus and method for flexibly bonding an integrated circuit package to a printed circuit board are provided. The apparatus includes a semiconductor having first and second sides, where the first side defines an inner region and peripheral region. The inner region is surrounded by the peripheral region. An interposer having a substantially similar coefficient of thermal expansion to the semiconductor is included. A dielectric region surrounding the interposer is included. The dielectric region is configured to be partially elastic. A plurality of posts extends transversely through the dielectric region. The post have first and second ends where the first end is configured to be attached to the peripheral region of the semiconductor chip. The second ends of the posts are configured to be attached to an external assembly, wherein the posts are able to absorb stress due to a thermal expansion mismatch between the external assembly and the interposer.

11 Claims, 9 Drawing Sheets

METHOD OF FABRICATING AN INTEGRATED CIRCUIT PACKAGE UTILIZING AN INTERPOSER SURROUNDED BY A FLEXIBLE DIELECTRIC MATERIAL WITH CONDUCTIVE POSTS

CROSS REFERENCE TO RELATED APPLICATIONS

This application is a divisional application of copending prior U.S. patent application Ser. No. 09/895,523 filed Jun. 29, 2001 now U.S. Pat. No. 6,525,407, and entitled "Integrated Circuit Package", which is herein incorporated by reference in its entirety.

BACKGROUND OF THE INVENTION

1. Field of the Invention

The present invention relates generally to semiconductor packaging, and more particularly to a packaging configuration capable of carrying a high density of transmission line structures that can be bonded directly to a printed wiring board.

2. Description of the Related Art

There are a very large number of integrated circuit packages on the market. Generally speaking the packaging process is a separate activity from production of the active die, and typically carried out by a packaging contractor. Packages are purchased by assembly contractors where product circuit boards are completed. Since these assembly contractors generally lack the technology to attach silicon die directly to a circuit board packaging contractors have provided this service. Attaching the silicon die is often done by ultrasonic wire bonding of pads on the integrated circuit (IC) to a lead frame. A hermetically sealed package, frequently plastic, is used to enclose the IC. In a final step the leads are cut and formed into pins forming the classic dual inline package as illustrated in block diagram 100 of FIG. 1. As IC technology has progressed there has been a move towards surface mounting packages with a high density of connections at the package periphery, such as the quad flat pack outline illustrated in block diagram 102 of FIG. 2.

Further increases in pin counts have forced two major changes. Firstly, there is a need for more than one row of contacts at the periphery of the device, as otherwise the pitch of the connections is too small for a reasonably strong bond to a circuit board to be formed by wire bonding processes. Secondly, the number of contacts to the chip is so large that wire bonding is becoming uneconomical. This has led to the development of the ball grid array and the flip chip packaging designs. Both technologies use solder balls, which are connected to the package or die. Heat is used to reflow the solder to make contact to the mating part, either a printed circuit board (PCB) or an interposer.

Because of the large thermal expansion difference between silicon and typical circuit boards, most packages use a substrate or interposer to redistribute the bonds from the die to the solder balls. More advanced packages may include several layers of wiring in the interposer along with integrated passives. The connection between the interposer (which is usually made of a laminate material) and the die has to take account of thermal expansion mismatch between the silicon and the interposer. There are a large number of ways of making the connection ranging from the traditional wirebond, through flip chip connections via solder balls as mentioned above (using an underfill adhesive to relieve the thermally induced strain in the balls), to micromachined fingers that can be bonded via conductive adhesive to the interposer. The purpose of the interposer is partly to provide for redistribution of wires, but also it allows a package with thermal expansion coefficient similar to the PCB to be provided to the assembly house. Therefore, the burden of accommodating the thermal mismatch between the die and the laminate is borne by the packager, not by the assembly contractor who generally has neither the skills nor the time to consider such matters.

A typical modern package is the flip-chip ball grid array (FCBGA) illustrated as block diagram 110 of FIG. 3. The FCBGA consists of a ceramic or plastic substrate that has an area array of solder balls 118 (typically composed of an eutectic alloy of tin and lead) for attachment to a circuit board. The semiconductor chip 112 is connected to the substrate 114 through solder bumps 116 in conjunction with an epoxy underfill between the chip 112 and the substrate 114.

Unfortunately, the technology available to process wiring on laminate material is less sophisticated than that used to develop the active silicon die. The thermal stability, dimensional stability, tendency to outgas contaminants, and other properties of laminate restrict the wiring that can be applied. However, one problem with a package using a non-laminate interposer is that the package must accommodate the thermal expansion differences between the selected interposer and a PCB. Most hard materials useful for high-precision processing have thermal expansion coefficients much less than that of the printed circuit board, thereby making the materials unsuitable as an interposer.

Another problem also related to the production of high speed integrated circuits is that the delays in on-die interconnects continue to increase as semiconductor device features shrink. In turn, the lines used for global interconnects continue to shrink in size along with the scaling of the chip. Because of the increasing RC delay (which is only partially offset by the shift to copper conductors and low-k dielectrics), a large number of repeaters, i.e., non-inverting buffer amplifiers, must be inserted into the global interconnect lines. These repeaters recover the integrity of the signal but at a cost of the gate delay in the repeater. As a result the speed of propagation in on-chip wires is expected to be steady at 40 ps/mm length in optimally repeatered wires. FIG. 4 illustrates graph 120 displaying the generally known relationship between relative signal delay vs. the process technology node. Each curve has been normalized to show the relative change in signal delay for different classes of interconnect. Line 122 represents the relative delays of global interconnects without repeaters, line 124 represents global interconnects with repeaters, line 126 represents local interconnects and line 128 represents gate delay (fan out 4) The gate delay represents the delay due to the transistor switching speed. Local interconnects are used to span clusters of a few transistors and are short compared with global interconnects. Moreover, the repeaters themselves are difficult to fabricate since connections must be made from top level metal to the transistor. In addition, the repeaters consume considerable power.

The velocity of wave propagation in an LC transmission line made in surroundings with relative dielectric constant $\in_r = 2.7$ is about 5 ps/mm, eight times faster than that in a repeatered line; but such lines must have a total resistance significantly less than the impedance of the transmission line. The practical limits on this impedance are 30–100 ohms. From this, it can be shown that a copper conductor 2 cm long should be at least 2.7 microns per side at low frequencies, rising to at least 5 microns at about 10 gigahertz (GHz) because of skin effects. FIG. 5 illustrates graph 130 representing the critical wire size for a square copper wire 2 cm long where Z=60Ω. Furthermore, to make a transmission line, the conductor must be in a well-controlled relationship with a grounded surface, and the necessary space between the conductor and this grounded surface further increase the space needed for the whole transmission line. Standard IC fabrication techniques are not well suited for these large structures because a considerable metal and dielectric thickness (~10 µm) is needed. Many IC techniques are optimized for the 0.1–1 µm thickness regime. Thicker layers may be better fabricated by lower cost techniques. However, the density of such interconnects, and the requirements for reasonable precision of spacing between the conductor and ground return path, means that printed circuit board technology is also unsuitable. The correct length scale lies between the PCB and high-end IC technology, in the length scales associated with magnetic disk head technology and micro-machine production.

Naeemi in "Performance improvement using on-board wires for on-chip interconnects," IEEE, October 2000, pp. 325–328, has shown that for future microprocessors the number of global interconnects longer than a few cm is limited to a few thousand. In a die projected to be as large as 40 mm per side, the number of lines pins needed to move all wires longer than longer than 3 cm off the die can be estimated at about 8000. This is a large number, but the same roadmaps show that such a die will have about 4000 power pins and 2000 I/O pins.

As a result, there is a need to solve the problems of the prior art to provide an interposer capable of carrying a high density of transmission line structures and accommodating a thermal expansion mismatch in order to bond the interposer to a printed circuit board.

SUMMARY OF THE INVENTION

Broadly speaking, the present invention fills these needs by providing a method for packaging an integrated circuit and packaging configuration where an interposer is enabled to carry a high density of transmission line structures. Additionally, the packaging configuration is capable of being bonded directly to a printed wiring board in a manner where a thermal expansion mismatch is accommodated. It should be appreciated that the present invention can be implemented in numerous ways, including as an apparatus, a system, a device, or a method. Several inventive embodiments of the present invention are described below.

In one embodiment, an integrated circuit package is provided. The apparatus includes a semiconductor having first and second sides, where the first side defines an inner region and peripheral region. The inner region is surrounded by the peripheral region. An interposer having a substantially similar coefficient of thermal expansion to the semiconductor is included. A dielectric region surrounding the interposer is also included. The dielectric region is configured to be partially elastic. A plurality of posts extends transversely through the dielectric region. The post have first and second ends where the first ends are configured to be attached to the peripheral region of the semiconductor chip. The second ends of the posts are configured to be attached to an external assembly, wherein the posts are able to absorb stress due to a thermal expansion mismatch between the external assembly and the interposer.

In another embodiment, a package for mounting an integrated circuit to a circuit board is provided. The package includes an integrated circuit and an interposer bonded to an inner region of the integrated circuit. A partially elastic dielectric medium surrounds the interposer. The elastic dielectric medium is configured to accommodate a plurality of posts. The posts have first and second ends, where the first ends of the posts are bonded to a peripheral region of the integrated circuit. The second ends of the posts are configured to be bonded to the circuit board.

In yet another embodiment, a method for fabricating an integrated circuit package is provided. The method initiates with providing a first and second wafer, where:the first wafer defines a plurality of semiconductor chips and the second wafer defines a plurality of interposer regions. The interposer regions have a substantially similar coefficient of thermal expansion to the semiconductor chips and each die of the first wafer is the same size as a corresponding die of the second wafer. Next, each of the interposer regions is surrounded with a flexible dielectric material. Then, a plurality of post are embedded transversely through the flexible dielectric material, where the posts have first and second ends. Then, the first wafer is bonded to the second wafer. The wafer bonding includes attaching an inner region of each semiconductor chip of the first wafer to a corresponding interposer of the second wafer and attaching the first ends of the posts to corresponding peripheral pads of the semiconductor chip. Next, each bonded die of the first and second wafers is singulated. Then the second ends of the posts are affixed to an external assembly.

In still another embodiment, a method for bonding two silicon die for subsequent bonding to a circuit board is provided. The method initiates with providing a first and second die with substantially similar coefficients of thermal expansion, where the first die is an integrated circuit and the second die is configured as an interposer. Next, a trench is formed surrounding the interposer. Then, the trench is filled with a partially elastic insulating material. Next, a plurality of holes is established in the trench. Posts are then created in each of the holes, where the posts have first and second ends. The first and second die are bonded to each other such that the interposer is bonded to an inner region of the first die and the first ends of the posts are bonded to peripheral contact pads of the first die. The second ends of the posts are then affixed to the circuit board.

In still yet another embodiment, a method for fabricating an integrated circuit package is provided. The method initiates with providing a plurality of singulated semiconductor chips. Then, a wafer defining a plurality of interposer regions is provided. The interposer regions have a substantially similar coefficient of thermal expansion to the semiconductor chips. Next, each of the interposer regions is surrounded with a flexible dielectric material. Then, a plurality of posts are embedded transversely through the flexible dielectric material where the posts have first and second ends. The semiconductor chips are then bonded to the wafer. The bonding includes attaching an inner region of each semiconductor chip to a corresponding interposer of the second wafer, and attaching the first ends of the posts to corresponding peripheral pads of the semiconductor chip. Next, each of the interposers of the wafer are singulated. Then, the second ends of the posts are affixed to an external assembly.

The advantages of the present invention are numerous. Most notably, the posts are able to deform due to the relatively elastic medium surrounding them. Therefore, excessive stress because of the thermal expansion mismatch is avoided. In addition, because the interposer and the active die are made of similar material, it is possible to use high densities of bonds without the need for underfill material.

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, in which like reference numerals designate like structural elements.

DETAILED DESCRIPTION OF THE PREFERRED EMBODIMENTS

The embodiments of the present invention provide an apparatus and a method of bonding two or more semiconductor substrates in a configuration that allows the entire assembly to be bonded subsequently to a printed circuit board. In accordance with one embodiment of the invention, a separate silicon die or interposer carries thick metallization layers consisting of well controlled wires and power planes, which are decoupled to ground. Bonds such as solder bonds are used to connect the interposer circuitry on the transistor bearing die or semiconductor substrate. It should be appreciated that the references to silicon as the material for the semiconductor substrates with respect to the disclosed embodiments are not meant to be restrictive. For example, a material such as gallium arsenide could be substituted for the silicon or a ceramic such as aluminum nitride for the interposer. Additionally, where references are made to copper metallization it should be further appreciated that metals such as aluminum may be substituted for the copper.

The embodiments described below allow for the deployment of many techniques from the integrated circuit (IC) fabrication arena. Concomitantly, the use of silicon as the interposer, while enabling the use of the IC techniques, allows for the flexibility to use lower cost versions of the same IC techniques. The lack of the presence of delicate transistors on the silicon interposer, as distinguished from the transistor-bearing die, allows for the relaxation of many of the constraints imposed to protect the delicate transistors, such as purity requirements. It should be appreciated, that due to the large scale of the structures i.e., diffusional leakage of the conductor through the dielectric is very slow. Additionally, the absence of copper sensitive transistors allows for the omission of certain layers, such as diffusion barriers. Thermal constraints due to thermal budget or radiation damage are not of great concern for a silicon interposer. The steps needed to make the thick wiring structures can occur concurrently with the fabrication of the main die (referred to as wafer scale processing) in one embodiment of the invention. Furthermore, features such as integrated optical interconnects are fabricated on the interposer without the need for their production to be compatible with the transistors and without taking up valuable real estate on the die in another embodiment. Also, it becomes possible to integrate compound semiconductors and other materials that would normally render a wafer unfit to return to a complementary metal oxide semiconductor (CMOS) fabrication line.

Figure 1:
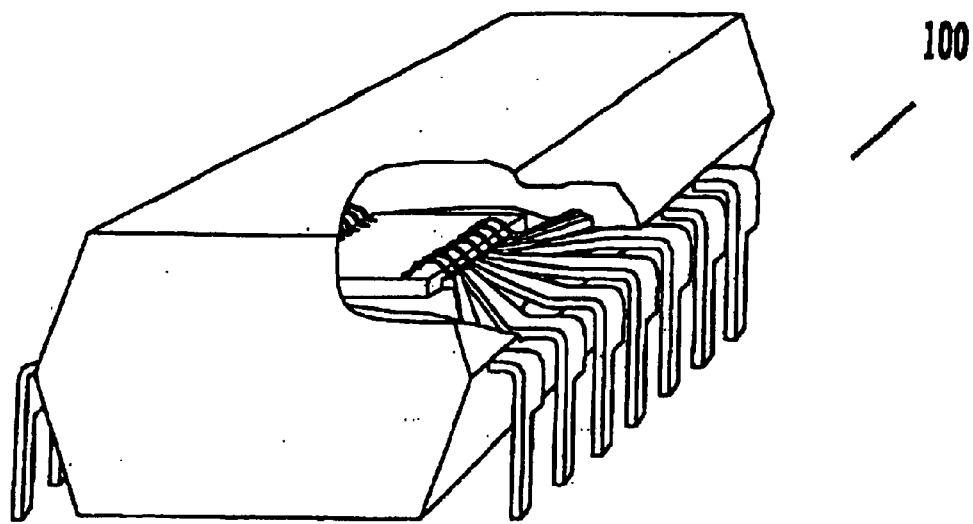
FIG. 1 illustrates a block diagram of a prior art dual inline package.
Figure 2:
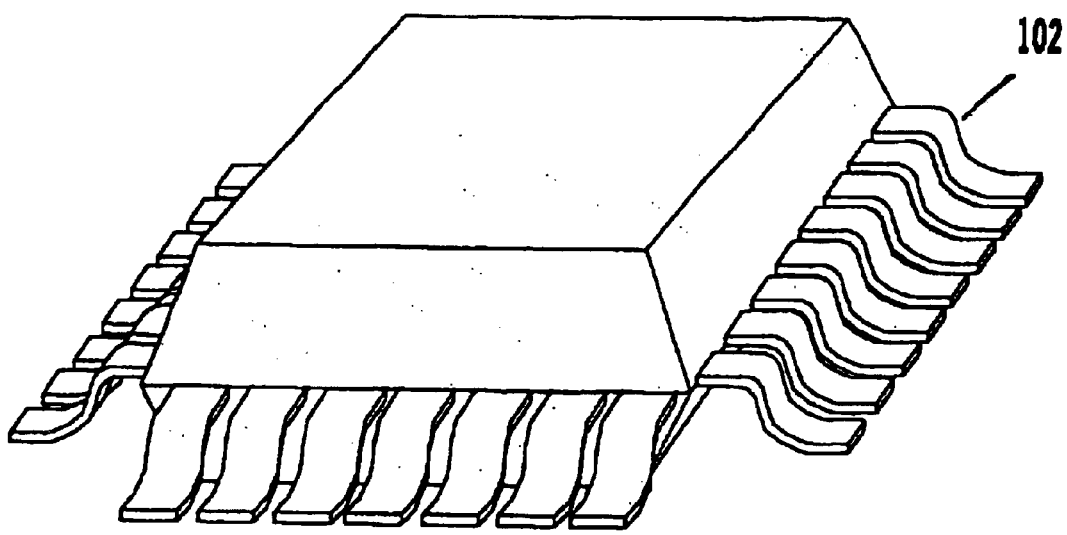
FIG. 2 illustrates a block diagram of a prior art quad flat pack.
Figure 3:
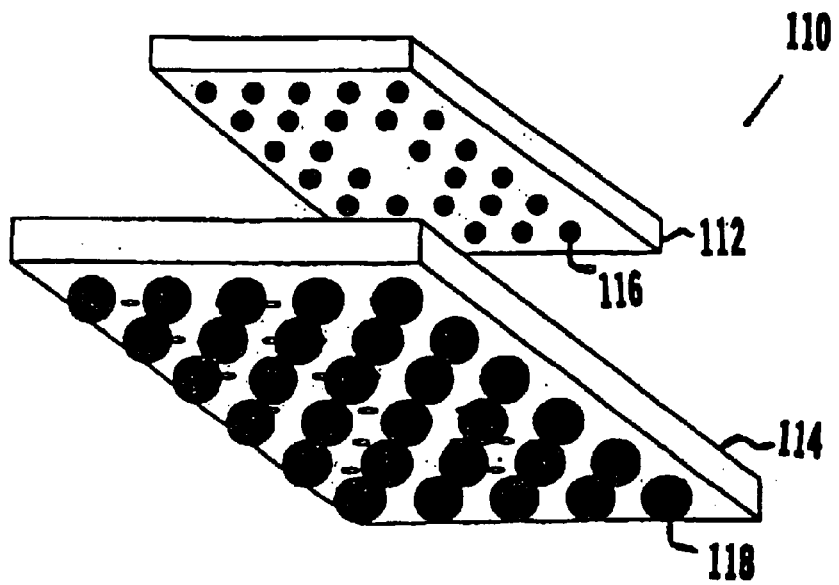
FIG. 3 illustrates a block diagram of a prior art flip chip ball grid array.
Figure 4:
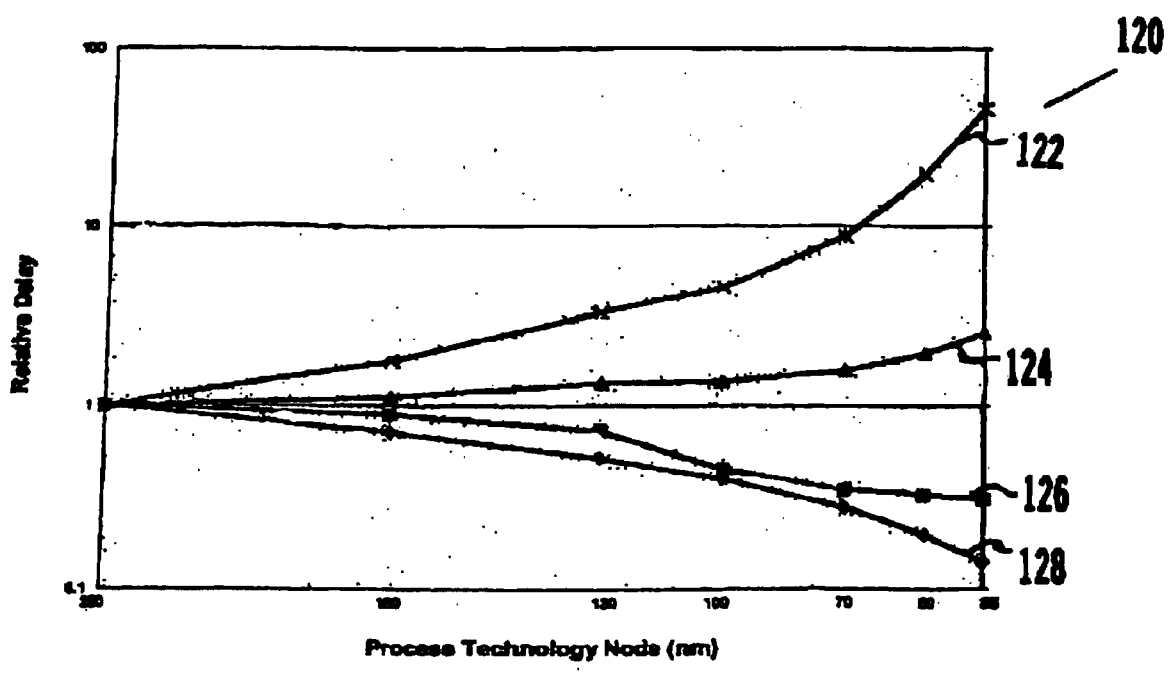
FIG. 4 illustrates a graph of the relative signal delay versus the process technology node.
Figure 5:
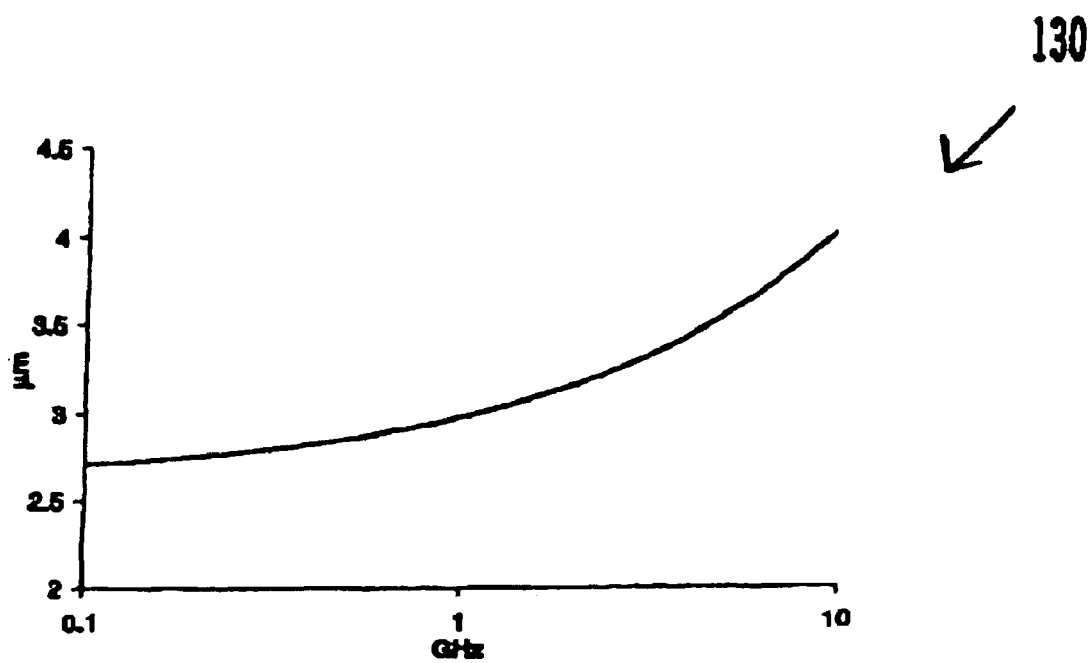
FIG. 5 illustrates a graph of the critical wire size for a square copper wire 2 cm. long versus the frequency.
Figure 6:
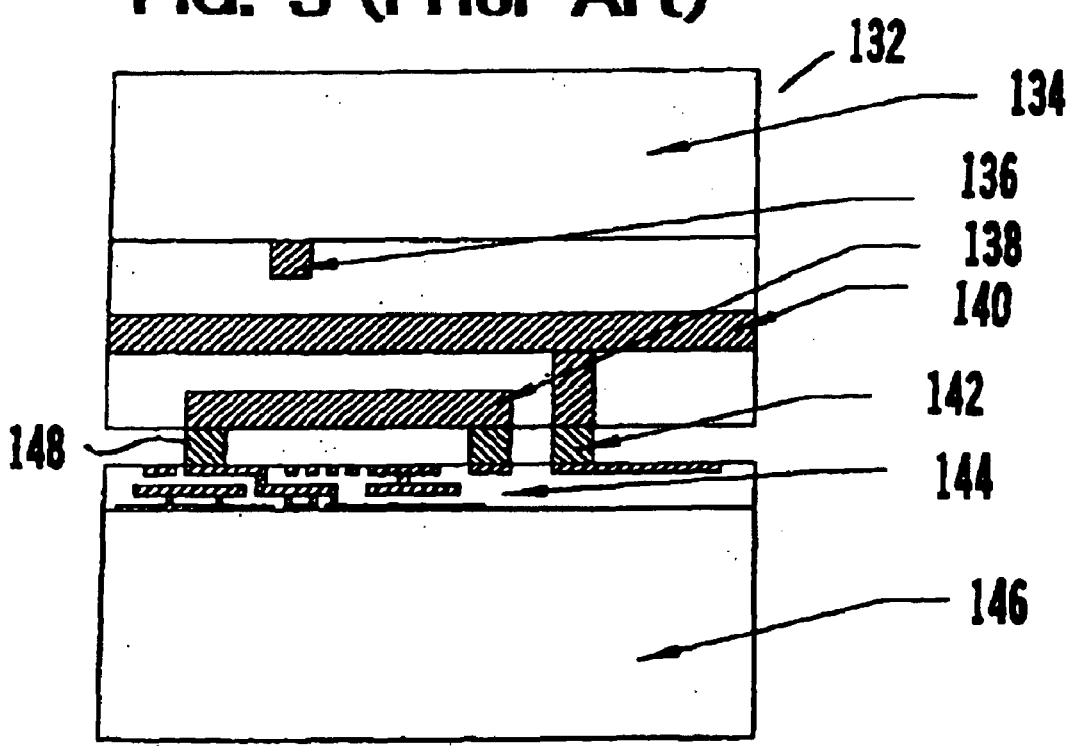
FIG. 6 illustrates a block diagram depicting a separate silicon interposer including global wiring and power distribution in accordance with one embodiment of the invention.

FIG. 6 illustrates block diagram 132 depicting a separate silicon interposer including global wiring and power distribution in accordance with one embodiment of the invention. A substrate 134 contains interconnect 136, long interconnect 138 and ground plane 140. In one embodiment, the substrate is silicon based. In another embodiment, the interposer 134 is bonded to the silicon substrate or integrated circuit 146, which contains on die metallization lines 144 and transistors. Ground input 142 and bond contacts 148 also connect between substrate 134 and substrate 146. The coefficient of thermal expansion of a silicon based interposer, such as interposer 134, is likely to be mismatched to that of the substrate to which the package as a whole is typically mounted to, i.e., epoxy laminate. Accordingly, a flexible bonding structure to accommodate the thermal expansion mismatch in order to protect the bonds between the interposer 134 and the integrated circuit 146 is described in more detail below.

Figure 7A:
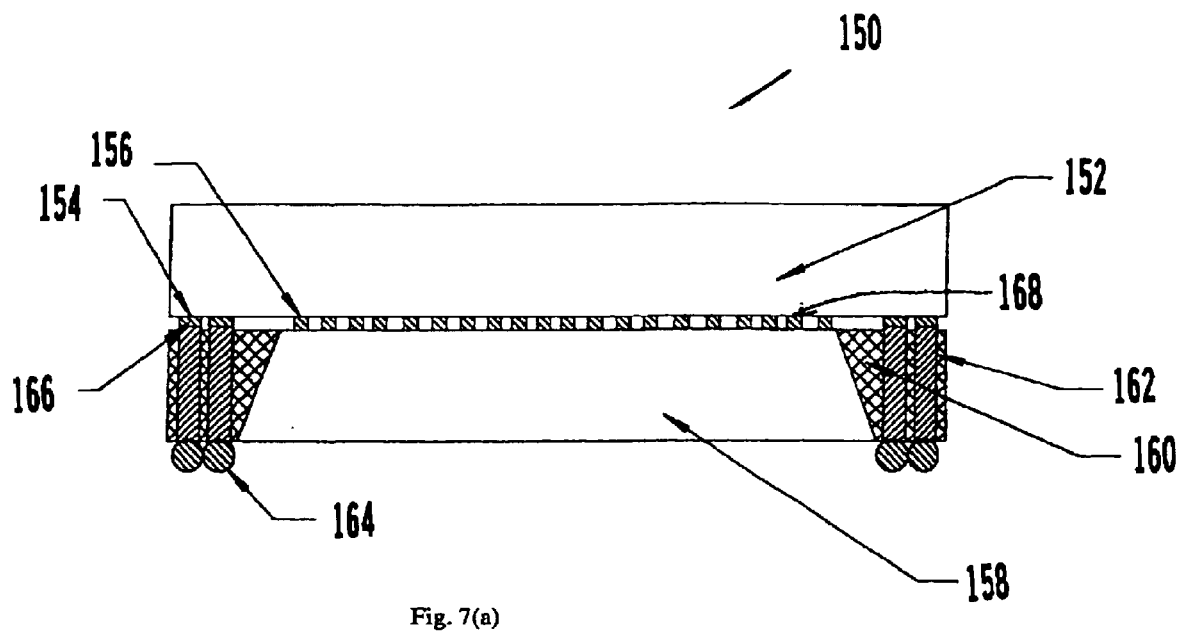
FIG. 7A illustrates a block diagram representing an integrated circuit package in accordance with one embodiment of the invention.

FIG. 7A illustrates block diagram 150 representing an integrated circuit package in accordance with one embodiment of the invention. The upper die 152 of block diagram 120 bears the active components. Upper die 152 has densely spaced pads 156 away from the edge of the die for connections to the interposer 158 and larger pads 154 near the periphery, for ultimately connecting to the external assembly via posts (not shown). Interposer 158 carries generally passive components as will be discussed in more detail below. The interposer 158 is surrounded by a dielectric 160. In one embodiment the dielectric 160 is a compliant or flexible material such as CYCLOTENE™ from Dow Corporation in Michigan, high temperature silicone rubber and parylene available from Allied Chemical Inc.

Continuing with block diagram 150, a large number of copper posts 162 pass through the dielectric 160 and are bonded at one end 166 to the upper die 152 and at the other end are free to be connected to a printed wiring board (also referred to as a printed circuit board) by reflow of the solder balls 164. The copper posts 162 may be fabricated from other soft metals, in particular lead, bismuth, tin, or antimony as well as a number of alloys such as tin/silver, Tin/silver/copper and bismuth/tin. The compliant nature of the dielectric 160 combined with the high length to width ratio of the copper posts 162 minimizes the shear forces arising from thermal cycling in order to protect the IC package from the thermal mismatch between the interposer and the printed circuit board. However, in the central area of the die there is no thermal mismatch between the substrate 152 and the interposer 158. It should be appreciated that a smaller bond 168 is made between the die 152 and the interposer 158. Accordingly, much higher densities of bonds 138 are possible than those achievable than when a polymeric interposer is used. In one embodiment the bonds 168 between the die 152 and the interposer 158 may be a ball grid array.

Figure 7B:
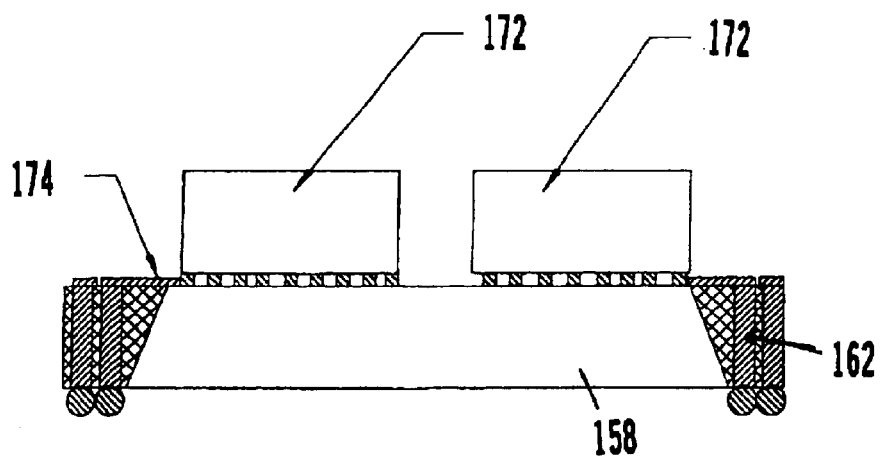
FIG. 7B illustrates a block diagram depicting an alternative embodiment of an integrated circuit package.

FIG. 7B illustrates a block diagram depicting an alternative embodiment of an integrated circuit package in accordance with one embodiment of the invention. Block diagram 170 includes two active die 172 which have been packaged on a single interposer 158. In this embodiment, the tops of the copper posts 162 have been connected to the circuitry on the interposer 158 via additional metallization lines 174. It should be appreciated that more than two active die may be included on a single interposer 158, whereby each active die is connected to the circuitry as described above.

Figure 8:
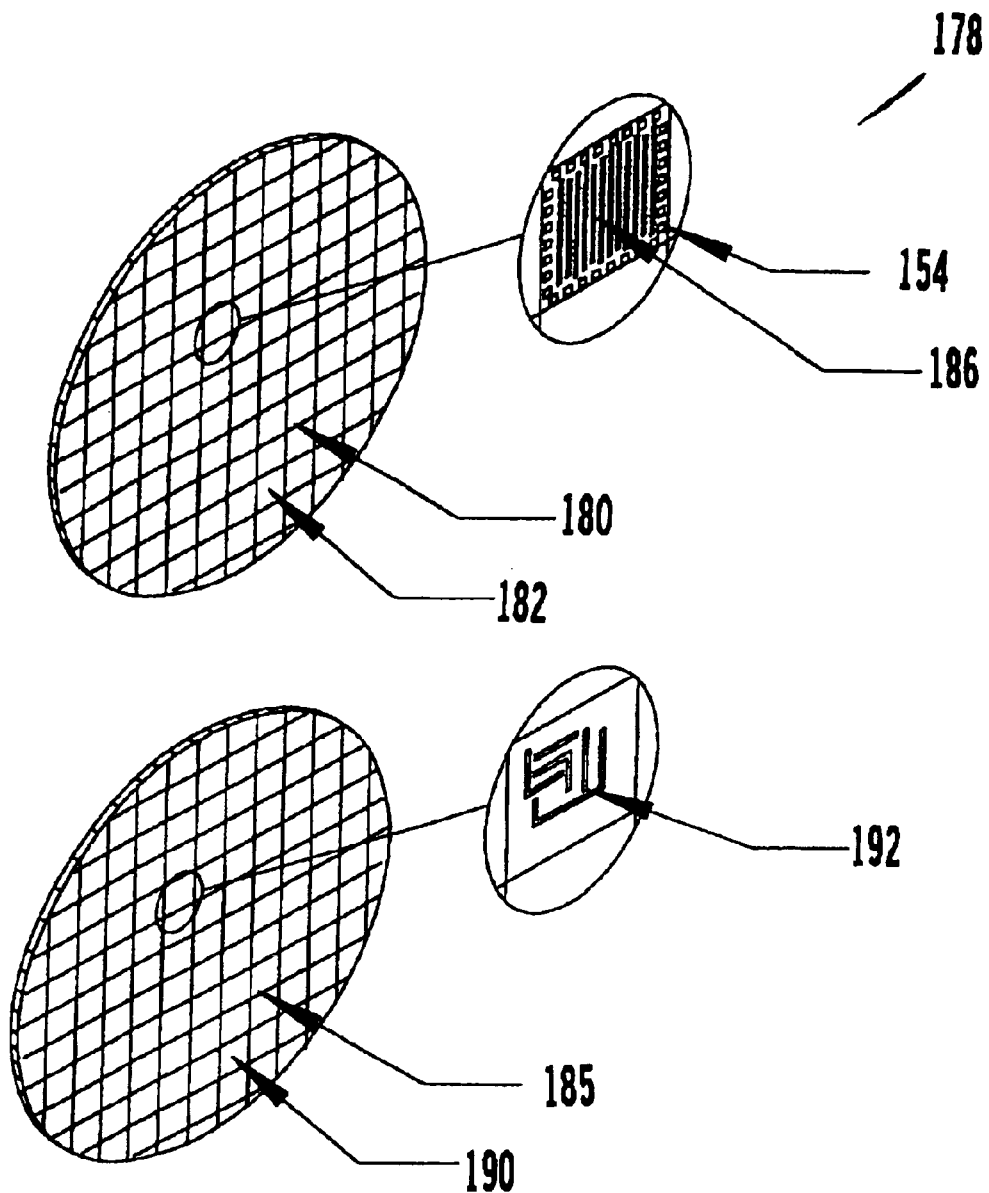
FIG. 8 illustrates a block diagram depicting a first and second processed wafer in accordance with one embodiment of the invention.

FIG. 8 illustrates block diagram 178 depicting a first and second processed wafer in accordance with one embodiment of the invention. Block diagram 178 displays a wafer 180 which has been processed into a plurality of die 182. In accordance with one embodiment of the invention, die 182 includes the transistors and lower levels of metallization forming an integrated circuit. Bond pads 154 are located near the periphery of the die. Additional bond pads 186 are located near the central area of the die. In one embodiment, the centrally located pads 186 are generally smaller and placed with higher density than the peripheral pads 154. The peripheral pads 154 carry input/output (IO) and power connections that will subsequently be led to the exterior circuit. In another embodiment, the peripheral pads 154 include contact pads for escape wiring such as the transmission lines referred to above.

Continuing with FIG. 8, a second wafer 185 includes a plurality of die 190 which have been processed to function as an interposer. In one embodiment metallization levels 192, includes integrated passives including inductors, resistors, and capacitors, all formed by well understood techniques, are deposited into the central area of the die. The interconnections may consist of global wiring, designed as transmission line structures; power distribution buses; and redistribution connections. In another embodiment the second die 190 includes optical interconnects, optical transmission devices such as avalanche light emitting diodes; optical receivers or optical modulators. All of the aforementioned interconnects and devices may be formed directly on the die 190 or formed separately.

Figure 9:
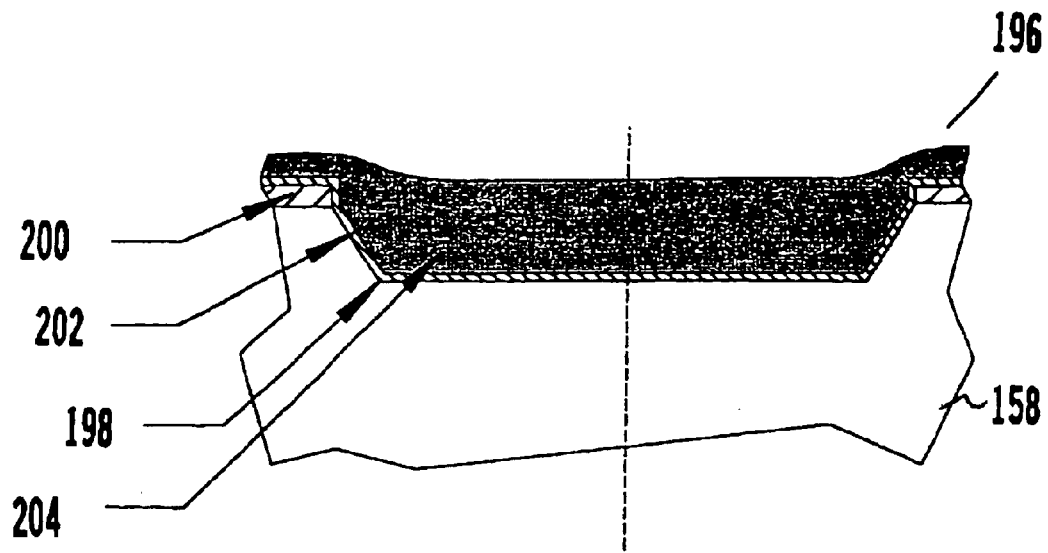
FIG. 9 illustrates a block diagram illustrating depicting a trench region formed around the interposer in accordance with one embodiment of the invention.

FIG. 9 illustrates block diagram 196 illustrating depicting a trench region formed around the interposer 158 in accordance with one embodiment of the invention. In one embodiment, trench 198 is formed by etching a wafer through a lithographic mask 200. The mask 200 is also referred to as a resist. It should be appreciated that the wafer may be wafer 188 of FIG. 8. In a preferred embodiment, trench 198 is formed by performing an etching operation in a heated solution of potassium hydroxide. In a preferred embodiment the temperature of the potassium hydroxide solution is between about 50° C. and about 90° C. Etching in a heated solution of potassium hydroxide yields a flat bottomed trench with sidewalls at a controlled angle of about 54°. It should be appreciated that the control angle is provided for illustrative purposes only and is not meant to be restrictive. As such, other etching operations providing different sidewall angles may be employed. In another preferred embodiment trench 198 is about 200 microns wide with a range; of about 50 microns to about 500 microns by about 100 microns deep wide with a range of about 30 microns to about 300 microns. Trench 198 is coated with a thin conductive seed layer 202. In one embodiment, the seed layer 202 consists of 150 nm of copper, formed by electroless deposition or sputtering. It should be appreciated that other layers such as titanium, tantalum and titanium nitride may be deposited at the same time to promote adhesion to the silicon and/or to the dielectric medium 204. The above described etching operation and seed layer deposition are not meant to be restrictive. Accordingly, the etching, deposition or sputtering operations may be any such operations well known in the art capable of yielding the desired trench dimensions or seed layers.

Continuing with FIG. 9, the trench 198 is filled with a well adhering, flexible, insulating medium 204. In one embodiment, adhesion promoters, such as DOW AP 4000 available from Dow Corporation, hexamethyl disilazane and AO9 available from Holdtite Inc. of the United Kingdom are used before addition of the insulator 204. The technique used to deposit this dielectric should be chosen so that the resulting layer is as planar as possible given the underlying geometry of the trench 198. A preferred technique will fill. the trench 198 while minimizing the dielectric thickness over the central part of the die. In one embodiment spin-on and print-on depositions of organics such as polyimide provide an acceptable trench fill technique. The insulating medium 204 is preferably photosensitive such as Dow CYCLOTENE™ 4022-35 from Dow Corporation and Toshiba KEMITITE CT4127L from Toshiba Inc.

Figure 10:
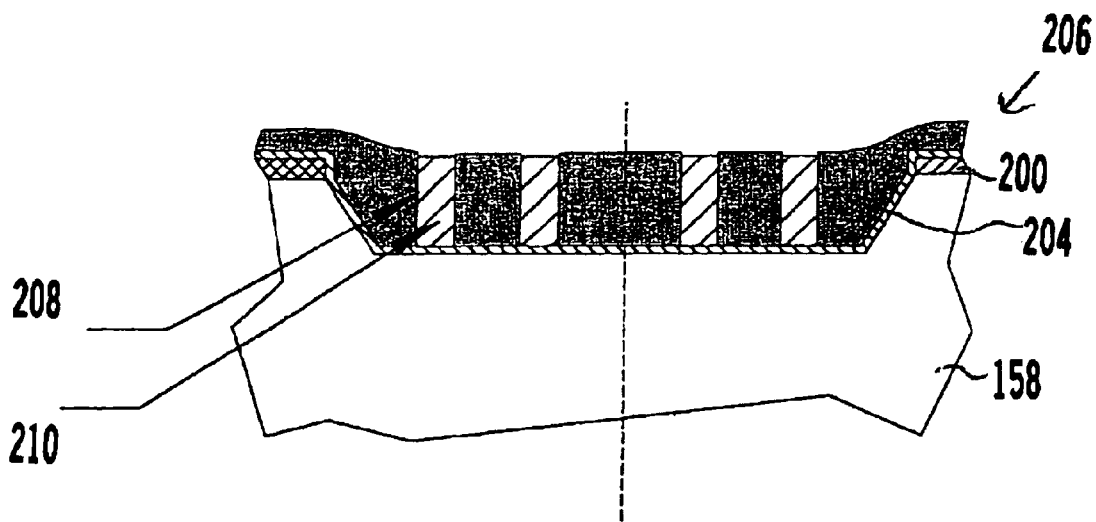
FIG. 10 illustrates a block diagram depicting a trench region where further processing has occurred in accordance with one embodiment of the invention.

FIG. 10 illustrates block diagram 206 depicting a trench region where further processing has occurred in accordance with one embodiment of the invention. Block diagram 206 is equivalent to block diagram 196 except that rows of holes 208 have been formed in the trench region. In one embodiment, the rows of holes 208 are formed by exposing the medium 204 to an appropriate light source through a mask and developing the resulting pattern. Standard lithography apparatus known to those skilled in the art may be used. In another embodiment, where the insulating medium 204 is not photosensitive, the holes are instead formed by the steps of removing the mask 200, forming a new mask lithographically in which the holes 208 are patterned; and anisotropically etching the holes 208 by a dry etching process such as reactive ion etching. In a preferred embodiment the holes 208 are formed by laser drilling using infrared laser or ultraviolet (UV) excimer laser. The holes 208 are then completely filled with copper to form posts 210. In a preferred embodiment, the copper posts 210 are filled by electroplating. Chemical mechanical polishing (CMP) may now be used to planarize the structure and remove excess material in one embodiment. The CMP process will stop at the seed layer 202, which should be composed of a metal with good selectivity to the CMP process such as tantalum.

It should be appreciated that the embedded posts, with a relatively high aspect ratio in a layer of a elastic medium, allows for the accommodation of the thermal mismatch between a silicon interposer and the laminate of the PCB. More specifically, when the ends of these posts 210 are bonded to a printed wiring board there is a thermal expansion mismatch. The tall, thin, posts 210 are able to deform without exerting so much stress on the printed wiring board (PWB) or the active die that there is failure.

Figure 11:
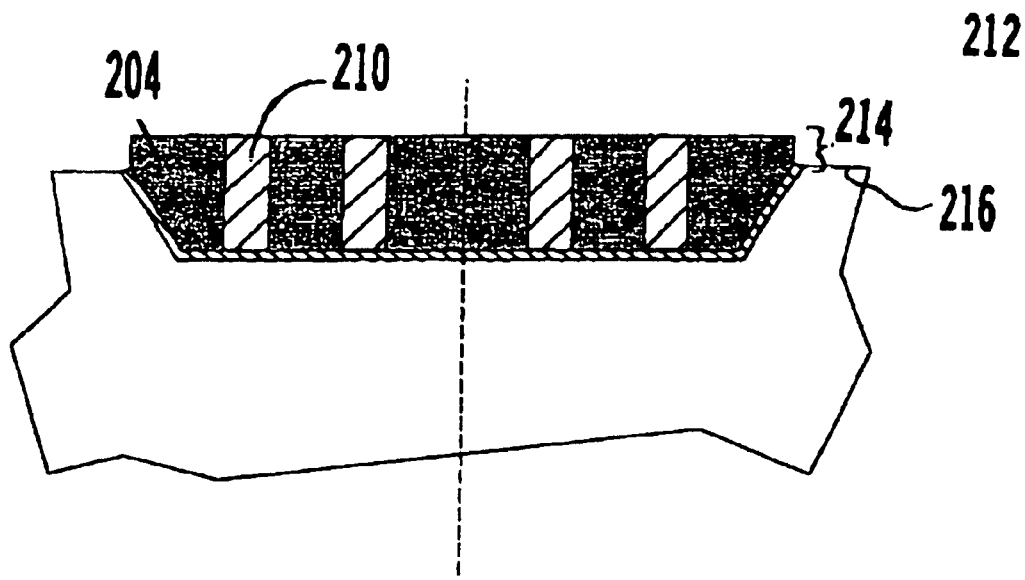
FIG. 11 illustrates a block diagram representing a processed trench region in which a resist has been removed in accordance with one embodiment of the invention.

FIG. 11 illustrates block diagram 212 representing a processed trench region in which the resist 200 has been removed in accordance with one embodiment of the invention. In this embodiment, removal of the mask 200 is accomplished by techniques well known to those skilled in the art. It should be appreciated that once the mask 200 is removed following the CMP processing, a portion of the seed layer 202 lifts off and leaves the structure shown in FIG. 11. It should be appreciated that because of the removal of the resist and the portion of the seed layer, the dielectric 204 and the posts 210 stand slightly proud of the die surface 216. In one embodiment, the height difference 214 of the dielectric 204 over the die surface 216 is about 1–3 microns. It should be further appreciated that this height difference allows solder reflow attachment of the interposer to the active die. In addition, the height difference resulting from removal of the mask 200 after CMP, provides definite control over the final spacing of the two silicon parts, i.e., interposer and active die, which is desirable as it leads to a more predictable solder bond and reduces the risk of a solder bump spreading out excessively and shorting to surrounding connections.

Figure 12:
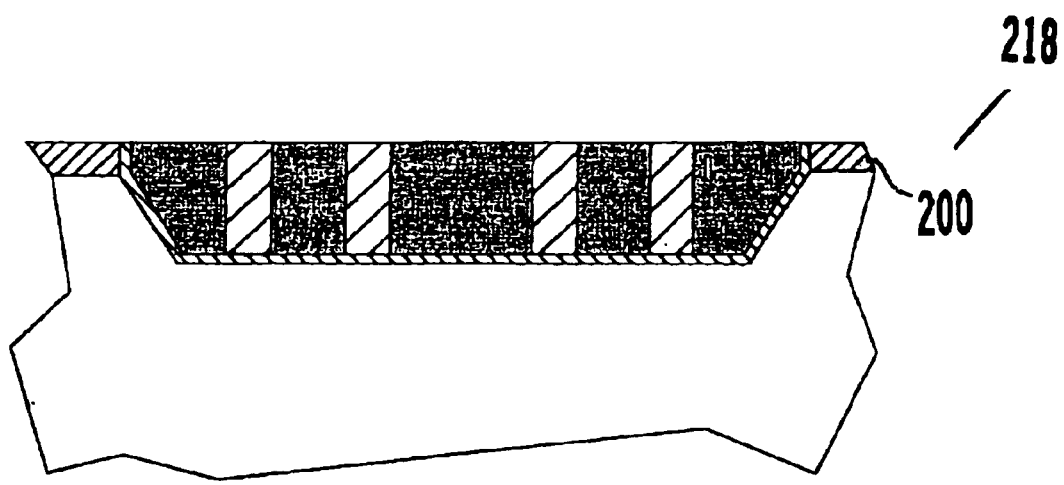
FIG. 12 illustrates a block diagram which represents a processed trench region where a resist is left in place in accordance with one embodiment of the invention.

FIG. 12 illustrates block diagram 218 which represents a processed trench region where the resist 200 is left in place in accordance with one embodiment of the invention. In this embodiment, spray etching or further CMP is used to remove any seed layer 202 remaining over the resist 200. In addition, in this embodiment the lithographic step that describes the trench regions must also remove the resist over the contact pads 154. The dielectric material 160 must also be removed from the same areas. It should be appreciated, that this embodiment allows the resist to be used as a solder mask for the contact pads 154, which saves a lithographic step as will be described in reference to FIG. 16.

Figure 13:
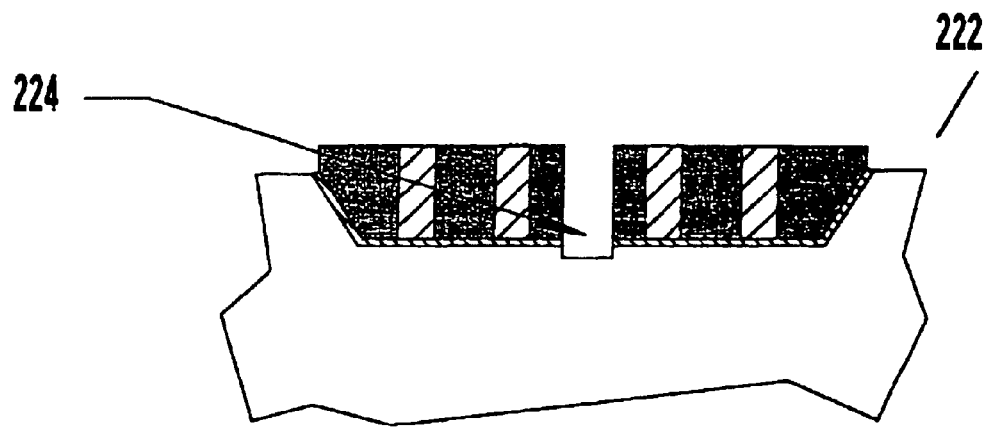
FIG. 13 illustrates a block diagram representing the removal of a portion of the dielectric in the trench region to allow for singulation of the die during backgrinding in accordance with one embodiment of the invention.

FIG. 13 illustrates block diagram 222 representing the removal of a portion of the dielectric 204 in the trench region to allow for singulation of the die during backgrinding in accordance with one embodiment of the invention. Block diagram 222 depicts a groove 224 created within the trench region containing the dielectric 204. It should be appreciated that the dielectric 204 may be removed by infrared or UV excimer laser treatment or sawing, or less economically by lithographic patterning and dry or wet etching, to form a groove 224. Since the groove 224 extends past the seed layer 202 and into the interposer substrate 226, when backgrinding of the wafer is performed, a wafer with these grooves 224 will automatically become an array of individual die. Accordingly, only the active die will require singulation since the backgrinding operation achieves the singulation of the wafer containing the interposer die in this embodiment.

Figure 14:
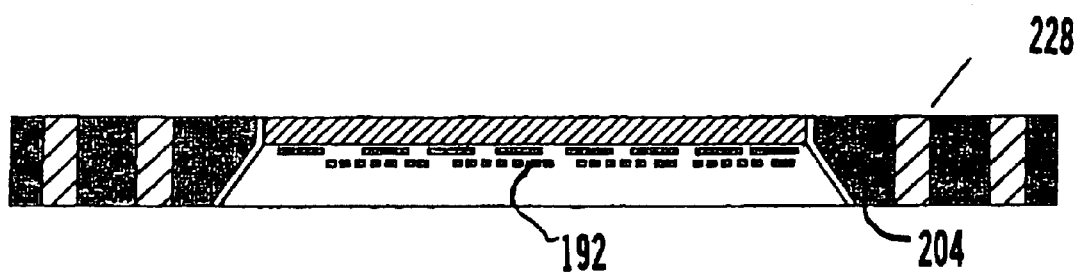
FIG. 14 illustrates block diagram 228 depicting a separated silicon die in accordance with one embodiment of the invention.

FIG. 14 illustrates block diagram 228 depicting a separated silicon die in accordance with one embodiment of the invention. Metallization levels 192 are illustrated within the interposer region. As discussed with respect to FIG. 8, interconnects and devices are included within the interposer region. Also illustrated in FIG. 14 is the dielectric material 204 surrounding the interposer region. It should be appreciated, that through backgrinding of the wafer embodiments of FIGS. 11–13, a number of separated silicon die as illustrated by FIG. 14 result. The separated silicon die is then assembled with the active die as described in more detail below in one embodiment. However, a preferred embodiment performs the backgrinding step after the processes and embodiments illustrated with respect to FIG. 15 or FIG. 16.

Figure 15:
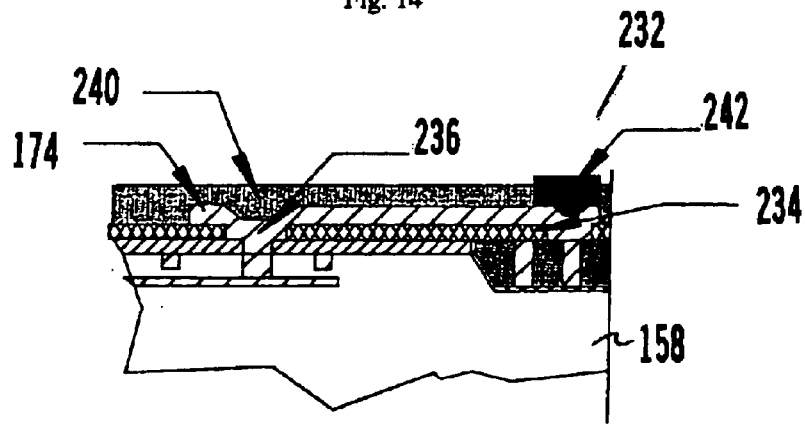
FIG. 15 illustrates a block diagram depicting the formation of the contacts for the interposer in accordance with one embodiment of the invention.

FIG. 15 illustrates block diagram 232 depicting the formation of the contacts for the interposer 158 in accordance with one embodiment of the invention. In block diagram 232, a dielectric layer 234 is deposited and patterned to form vias 236 to the contact posts 210 and pads on the die as appropriate. Then, a final layer of metal 174 is deposited and patterned to form the final contacts from the circuitry inside the package. A solder mask 240 is then deposited and patterned, opening contacts over the copper posts 210 and also over all contact pads that will make contact to the active die. Solder is then applied by screen printing, or by through-resist electroplating (at the cost of an extra lithographic step) or by ball placement. Reflow is used to form a solder contact 242 at the end of the post 210.

Figure 16:
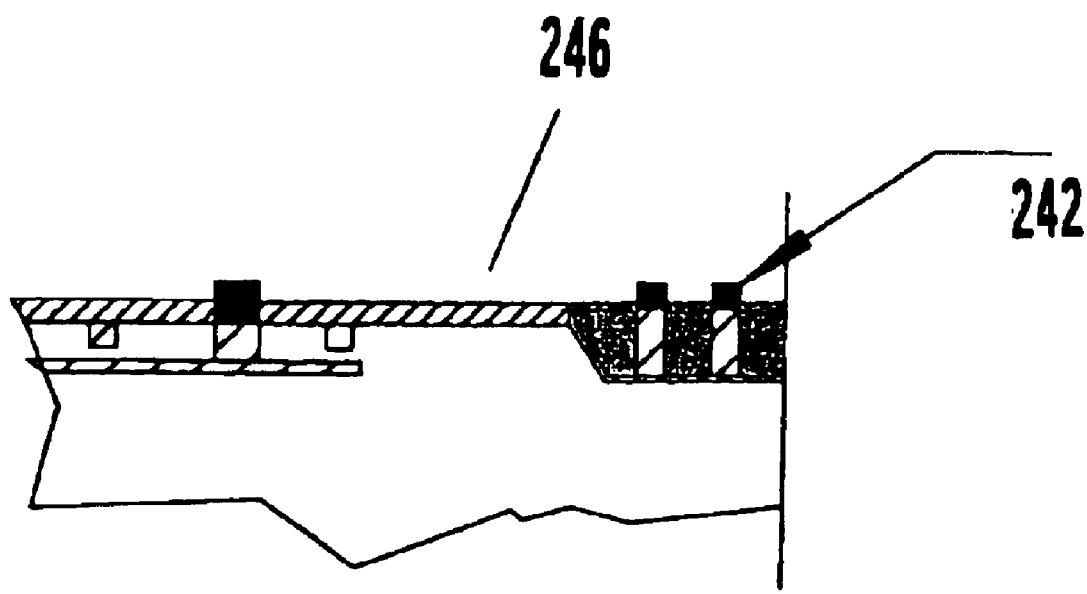
FIG. 16 illustrates a block diagram representing a preferred structure for the formation of the contacts for the interposer in accordance with one embodiment of the invention.

FIG. 16 illustrates block diagram 246 representing a preferred structure for the formation of the contacts for the interposer 158 in accordance with one embodiment of the invention. The structure of FIG. 16 is equivalent to the structure of FIG. 15 except that the preliminary redistribution (using the dielectric layer 234 and metal layer 174) is omitted and the resist layer, referred to earlier with respect to FIG. 12, acts as the solder mask. It should be appreciated, that by using the resist as the solder mask saves up to three deposition and lithography steps. In this embodiment all IO and power connections will run across the surface of active die 182 before passing out of the package. In most applications this is necessary, because the active die 182 will contain active components that are needed to convert the internal IC signal into levels that are suitable for connection to the external world, as well as components for electrostatic discharge protection. The economy of the design represented by FIG. 16 should be appreciated since it is capable of using as few as two lithographic steps (after fabrication of the wiring levels) to arrive at the structure of block diagram 246.

The assembly of the active die and the interposer consists of accurately aligning them face to face and applying heat and/or pressure to form a permanent electrical contact. The choice of the best process conditions will depend on whether multiple active dice are to be added to the interposer. Where multiple active dice are to be added to the interposer, it is clear that the active dice must be singulated before attachment to the interposer. In applications where there is only one active die it may be more economical to perform full wafer-to-wafer bonding with singulation following bonding. This wafer-scale process offers superior throughput when compared to the case where singulation is done before assembly. Finally, the ratio of the die size must be considered. If the entire device (interposer plus active dice) can be made more economically using smaller active die as compared with the interposer size, the technique described above with respect to FIG. 15, involving signal redistribution, will have to be used.

Figure 17:
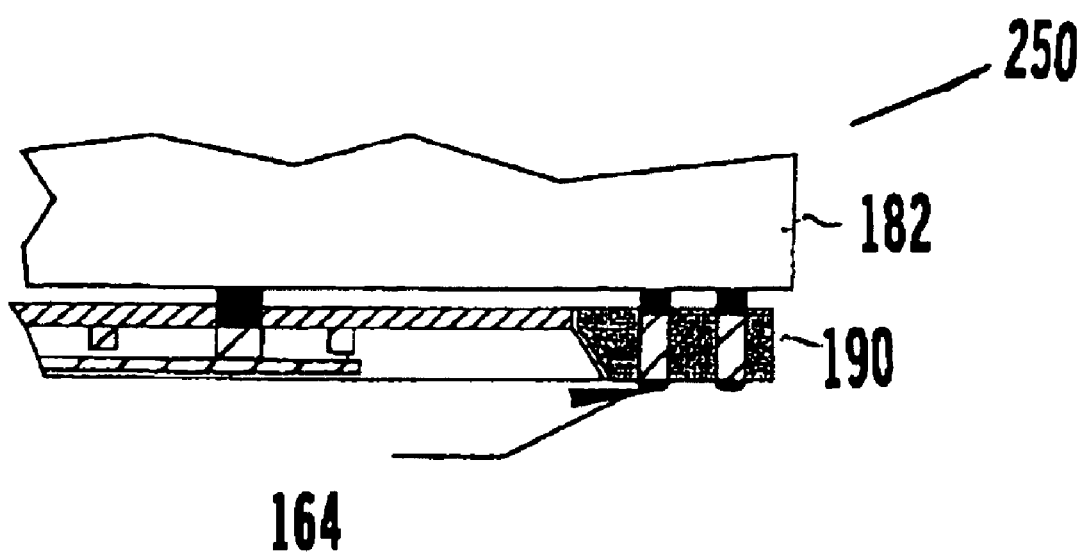
FIG. 17 illustrates a block diagram depicting the singulated bonded active and interposer die of the wafer scale process in accordance with one embodiment of the invention.

FIG. 17 illustrates block diagram 250 depicting the singulated bonded active and interposer die of the wafer scale process in accordance with one embodiment of the invention. In the wafer-scale process, the bond is formed when the solder contact 242 is reflowed by heating. Electrical and mechanical bonds are made from the pads on die 190 to the facing pads on die 182. The bonded wafers are now mounted in a grinding apparatus with the rear of wafer 188 facing the grinding surface, and the wafer 188 ground away until the copper posts 210 are exposed. In one embodiment, a treatment (either a wet chemical etch or a plasma treatment) is now carried out to remove wafer damage caused by grinding, so as to restore the mechanical strength of the wafer 188. Using electroplating, stencil application or ball attachment, solder is applied to the exposed ends of the posts 210 and reflowed to form solder balls 164.

It will normally be desired to thin the wafer carrying the active die 182. This would preferably be done by mounting the wafers to a temporary support and grinding away the undesired material in one embodiment of the invention. The die 182 can now be singulated using a wafer saw and the packages removed from the temporary support upon completion of the singulation.

Wafer scale processing such as described above is preferable when all processes have a high yield so that few bad die are processed. Additionally, the active die 182 must be the same size as the interposer die 190 and there must only be one active die per interposer. Often these conditions will not be satisfied. In this case, the interposers will usually be thinned, and the wafer cut into streets. In one embodiment, the wafer is cut by singulating along scribe lines. Using automated placement tools the active die 182 will be positioned and bonded to the interposer 190. Note that in this case the redistribution method described above is needed to connect to the copper posts. The interposer then forms a highly versatile "system in package" substrate. Individual, tested, active die can be connected and integrated using the silicon interposer with the advanced structures referred to above such as optical interconnects, electrical waveguide interconnects, and integrated passives. The resulting package can be bonded directly to an external assembly, such as a PCB.

The above described embodiments allows for high densities of bonds between the interposer and the active die made out of silicon or substitutes mentioned herein. In addition, it should be appreciated that an underfill material as required by die larger than a few millimeters per side is no longer required for the embodiments described above. Furthermore, the above described embodiments of the integrated circuit package enables the use of advanced high-density wiring between separate dice in future high-speed ICs.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A method for fabricating an integrated circuit package, comprising:
   providing a first and second wafer, the first wafer defining a plurality of semiconductor chips, the second wafer defining a plurality of interposer regions, the interposer regions having a substantially similar coefficient of thermal expansion to the semiconductor chips, wherein each die of the first wafer is the same size as a corresponding die of the second wafer;
   surrounding each of the interposer regions with a flexible dielectric material;
   embedding a plurality of posts transversely through the flexible dielectric material, the posts having first and second ends;
   bonding the first wafer to the second wafer, the bonding further including,
     attaching an inner region of each semiconductor chip of the first wafer to a corresponding interposer of the second wafer, and
     attaching the first ends of the posts to corresponding peripheral pads of the semiconductor chip;
   singulating each bonded die of the first and second wafers; and
   affixing the second ends of the posts to an external assembly.

2. The method of fabricating an integrated circuit package as recited in claim 1 wherein, singulating each bonded die of the first and second wafers further comprises:
   backgrinding the second wafer.

3. The method of fabricating an integrated circuit package as recited in claim 1 further comprising:
   forming contacts for the interposer regions, the contacts running across a surface of the semiconductor chip.

4. A method of bonding two silicon die for subsequent bonding to a circuit board, comprising:
   providing a first and second die with substantially similar coefficients of thermal expansion, the first die being an integrated circuit, the second die being configured as an interposer;
   forming a trench on the second die;
   filling the trench with a partially elastic insulating material;
   establishing a plurality of holes in the elastic insulating material in the trench;
   creating posts in each of the holes, the posts having a first and a second end;
   bonding the first and second die to each other such that the interposer is bonded to an inner region of the first die and the first ends of the posts are bonded to peripheral contact pads of the first die; and
   affixing the second ends of the posts to the circuit board.

5. The method of bonding two silicon die for subsequent bonding to a circuit board as recited in claim 4 wherein, multiple integrated circuits are bonded to the interposer.

6. The method of bonding two silicon die for subsequent bonding to a circuit board as recited in claim 4 wherein, an underfill material between the first and second die is eliminated.

7. A method for fabricating an integrated circuit package, comprising:
   providing a plurality of singulated semiconductor chips;
   providing a wafer, the wafer defining a plurality of interposer regions, the interposer regions having a substantially similar coefficient of thermal expansion to the semiconductor chips;
   surrounding each of the interposer regions with a flexible dielectric material;
   embedding a plurality of posts transversely through the flexible dielectric material, the posts having first and second ends;
   bonding the semiconductor chips to the wafer, the bonding further including, attaching an inner region of each semiconductor chip to a corresponding interposer of the second wafer, and attaching the first ends of the posts to corresponding peripheral pads of the semiconductor chip;

singulating each of the interposers of the wafer; and affixing the second ends of the posts to an external assembly.

8. The method for fabricating an integrated circuit package as recited in claim 7, wherein the singulation is performed by backgrinding.

9. The method for fabricating an integrated circuit package as recited in claim 7 wherein a resist layer is utilized as a solder mask when attaching the first ends of the posts.

10. The method for fabricating an integrated circuit package as recited in claim 7, wherein, the interposers are thinned.

11. The method for fabricating an integrated circuit package as recited in claim 7 wherein, the external assembly is a printed circuit board.

* * * * *